United States Patent
Kim et al.

(10) Patent No.: US 10,425,104 B2
(45) Date of Patent: Sep. 24, 2019

(54) SCHEDULING METHOD OF A PARITY CHECK MATRIX AND AN LDPC DECODER FOR PERFORMING SCHEDULING OF A PARITY CHECK MATRIX

(71) Applicant: Electronics and Telecommunications Research Institute, Daejeon (KR)

(72) Inventors: Min Hyuk Kim, Daejeon (KR); Youngmin Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 15/809,392

(22) Filed: Nov. 10, 2017

(65) Prior Publication Data
US 2018/0138924 A1  May 17, 2018

(30) Foreign Application Priority Data
Nov. 11, 2016 (KR) .................. 10-2016-0150426
Oct. 30, 2017 (KR) .................. 10-2017-0142382

(51) Int. Cl.
H03M 13/11 (2006.01)
H03M 13/00 (2006.01)

(52) U.S. Cl.
CPC ...... *H03M 13/1174* (2013.01); *H03M 13/118* (2013.01); *H03M 13/1117* (2013.01); *H03M 13/1131* (2013.01); *H03M 13/1134* (2013.01); *H03M 13/1137* (2013.01); *H03M 13/1145* (2013.01); *H03M 13/6566* (2013.01)

(58) Field of Classification Search
CPC .................................................. H03M 13/11
USPC ......................................... 714/752, 755, 757
See application file for complete search history.

(56) References Cited

U.S. PATENT DOCUMENTS

| | | | |
|---|---|---|---|
| 8,516,347 B1 * | 8/2013 | Li | H03M 13/1114 714/778 |
| 2005/0180459 A1 * | 8/2005 | Watson | H03M 13/1111 370/468 |
| 2011/0252294 A1 | 10/2011 | Ng et al. | |
| 2014/0089766 A1 | 3/2014 | Lee et al. | |
| 2016/0043745 A1 * | 2/2016 | Vojcic | H04L 1/005 714/755 |
| 2016/0072524 A1 | 3/2016 | Park et al. | |
| 2018/0163032 A1 * | 6/2018 | Gopalan | C08F 255/02 |

FOREIGN PATENT DOCUMENTS

| | | |
|---|---|---|
| KR | 10-2009-0092892 A | 9/2009 |
| KR | 10-2016-0116980 A | 10/2016 |

* cited by examiner

*Primary Examiner* — Fritz Alphonse
(74) *Attorney, Agent, or Firm* — NSIP Law

(57) ABSTRACT

Provided is a method of scheduling a parity check matrix, the method performed by a low-density parity-check (LDPC) decoder, the method including checking at least one non-zero elemental variable node in the parity check matrix, identifying a first index of a row of the parity check matrix in the at least one non-zero elemental variable node, extracting a column in which the at least one non-zero elemental variable node is positionable from the parity check matrix using the first index, and mapping the at least one non-zero elemental variable node to the extracted column based on an arrangement, and identifying a second index of the column of the parity check matrix through the mapped at least one non-zero elemental variable node.

15 Claims, 15 Drawing Sheets

FIG. 3

| 0 | 1 | 2 | 3 | 4 | 5 | 6 | 7 |
|---|---|---|---|---|---|---|---|
| 0 | 1 | 2 | 3 | 4 | 5 | 6 | 7 |
| 0 | 1 | 2 | 3 | 4 | 5 | 6 | 7 |
| 0 | 1 | 2 | 3 | 4 | 5 | 6 | 7 |

FIG. 5

| 0 | 0 | 0 | 1 | 1 | 2 | 2 | 3 | 4 | 5 | 6 | 7 |

FIG. 7

| 0 | 1 | 2 | 3 | 4 | 5 | 6 | 7 |
|---|---|---|---|---|---|---|---|
| 0 | 1 | 2 | 3 | 4 | 5 | 6 | 7 |
| 0 | 1 | 2 | 3 | 4 | 5 | 6 | 7 |
| 0 | 1 | 2 | 3 | 4 | 5 | 6 | 7 |

FIG. 8

| 0 | 0 | 0 | 1 | 1 | 2 | 2 | 3 | 4 | 5 | 6 | 7 |
|---|---|---|---|---|---|---|---|---|---|---|---|

SCHEDULING METHOD OF A PARITY CHECK MATRIX AND AN LDPC DECODER FOR PERFORMING SCHEDULING OF A PARITY CHECK MATRIX

CROSS REFERENCE TO RELATED APPLICATION(S)

This application claims the benefit under 35 USC 119(a) of Korean Patent Application No. 10-2016-0150426, filed on Nov. 11, 2016 and Korean Patent Application No. 10-2017-0142382, filed on Oct. 30, 2017, in the Korean Intellectual Property Office, the entire disclosures of which are incorporated herein by reference for all purposes.

BACKGROUND

1. Field

One or more example embodiments relate to a method of scheduling a parity check matrix and a low-density parity-check (LDPC) decoder for performing the method, and more particularly, to a method of scheduling a parity check matrix that may simultaneously perform a check node update (CNU) and a variable node update (VNU) through a first index and a second index without causing a memory access conflict and an LDPC decoder for performing the method.

2. Description of Related Art

Recently, coding using low-density parity-check (LDPC) codes has emerged. The LDPC codes were suggested by Gallager in 1962 as low-density linear block codes with a parity check matrix H including the majority of elements being "0". Since the LDPC codes are extremely complex and thus could not be implemented using the technology at the time, the LDPC codes had been forgotten. However, since the LDPC codes were rediscovered in 1995 and the excellent performance thereof has been proved, researches on the LDPC codes have been actively conducted recently. The parity check matrix of the LDPC codes includes a few "1"s, the LDPC codes may be decoded through iterative decoding even for a very large block size. When the block size greatly increases, the LDPC codes exhibit the performance which approximates a Shannon channel capacity limit like turbo codes, and enable fast processing through parallel processing.

However, when a check node update (CNU) is performed for parallel decoding using the LDPC codes, a memory access conflict may occur in different rows, or in the same row like a dual-diagonal matrix.

SUMMARY

An aspect provides a method of scheduling a parity check matrix that may prevent a memory access conflict occurring when fast decoding is performed using low-density parity-check (LDPC) codes, and an LDPC decoder for performing the method.

Another aspect also provides a method of scheduling a parity check matrix that may prevent a memory access conflict by remapping at least one variable node or check node through a cyclic shift of the at least one variable node or check node when mapping fails, and an LDPC decoder for performing the method.

Still another aspect also provides an LDPC decoder that may perform fast LDPC decoding, despite a large size of a parity check matrix and a number of iterations.

According to an aspect, there is provided a method of scheduling a parity check matrix, the method performed by an LDPC decoder, the method including checking at least one non-zero elemental variable node in the parity check matrix, identifying a first index of a row of the parity check matrix in the at least one non-zero elemental variable node, extracting a column in which the at least one non-zero elemental variable node is positionable from the parity check matrix using the first index, mapping the at least one non-zero elemental variable node to the extracted column based on an arrangement, and identifying a second index of the column of the parity check matrix through the mapped at least one non-zero elemental variable node.

The method may further include simultaneously performing a check node update (CNU) and a variable node update (VNU) using the first index and the second index.

The second index may indicate a column of the parity check matrix used along with a row corresponding to the first index to simultaneously perform the CNU and the VNU.

The first index may be identified by grouping the at least one non-zero elemental variable node of the parity check matrix based on the row.

The mapping may include identifying a position at which the at least one non-zero elemental variable node is unpositionable, through the first index, and sequentially positioning the at least one non-zero elemental variable node at a position at which the at least one non-zero elemental variable node is positionable.

The arrangement of the at least one non-zero elemental variable node may be a sequential arrangement of the at least one non-zero elemental variable node based on the column of the parity check matrix.

According to another aspect, there is also provided a method of scheduling a parity check matrix, the method performed by an LDPC decoder, the method including checking at least one non-zero elemental variable node in the parity check matrix, identifying a first index of a row of the parity check matrix in the at least one non-zero elemental variable node, remapping the at least one non-zero elemental variable node through a cyclic shift of an arrangement of the at least one non-zero elemental variable node using the first index, when mapping of the at least one non-zero elemental variable node to a column in which the at least one non-zero elemental variable node is positionable in the parity check matrix based on the arrangement fails, and identifying a second index of the column of the parity check matrix through the mapped at least one non-zero elemental variable node.

The cyclic shift may cyclically shift the at least one non-zero elemental variable node included in a single column to perform a VNU operation with respect to the single column.

According to still another aspect, there is also provided a method of scheduling a parity check matrix, the method performed by an LDPC decoder, the method including checking at least one non-zero elemental check node in the parity check matrix, identifying a first index of a row of the parity check matrix in the at least one non-zero elemental check node, remapping the at least one non-zero elemental check node through a cyclic shift of an arrangement of the at least one non-zero elemental check node using the first index, when mapping of the at least one non-zero elemental check node to a column in which the at least one non-zero elemental check node is positionable in the parity check matrix based on the arrangement fails, and identifying a second index of the column of the parity check matrix through the mapped at least one non-zero elemental check node.

The cyclic shift may cyclically shift the at least one non-zero elemental check node included in a single row to perform a CNU operation with respect to the single row.

According to yet another aspect, there is also provided an LDPC decoder including a processor configured to check at least one non-zero elemental variable node in the parity check matrix, identify a first index of a row of the parity check matrix in the at least one non-zero elemental variable node, extract a column in which the at least one non-zero elemental variable node is positionable from the parity check matrix using the first index, map the at least one non-zero elemental variable node to the extracted column based on an arrangement, and identify a second index of the column of the parity check matrix through the mapped at least one non-zero elemental variable node.

The processor may be configured to simultaneously perform a CNU and a VNU using the first index and the second index.

The second index may be used along with a row corresponding to the first index to simultaneously perform the CNU and the VNU.

The first index may be identified by grouping the at least one non-zero elemental variable node of the parity check matrix based on the row.

The processor may be configured to, when mapping the at least one non-zero elemental variable node, identify a position at which the at least one non-zero elemental variable node is unpositionable, through the first index, and sequentially position the at least one non-zero elemental variable node at a position at which the at least one non-zero elemental variable node is positionable.

The arrangement of the at least one non-zero elemental variable node may be a sequential arrangement of the at least one non-zero elemental variable node based on the column of the parity check matrix.

According to further another aspect, there is also provided an LDPC decoder including a processor configured to check at least one non-zero elemental variable node in the parity check matrix, identify a first index of a row of the parity check matrix in the at least one non-zero elemental variable node, remap the at least one non-zero elemental variable node through a cyclic shift of an arrangement of the at least one non-zero elemental variable node using the first index, when mapping of the at least one non-zero elemental variable node to a column in which the at least one non-zero elemental variable node is positionable in the parity check matrix based on the arrangement fails, and identify a second index of the column of the parity check matrix through the mapped at least one non-zero elemental variable node.

The cyclic shift may cyclically shift the at least one non-zero elemental variable node included in a single column to perform a VNU operation with respect to the single column.

According to still another aspect, there is also provided an LDPC decoder including a processor configured to check at least one non-zero elemental check node in the parity check matrix, identify a first index of a row of the parity check matrix in the at least one non-zero elemental check node, remap the at least one non-zero elemental check node through a cyclic shift of an arrangement of the at least one non-zero elemental check node using the first index, when mapping of the at least one non-zero elemental check node to a column in which the at least one non-zero elemental check node is positionable in the parity check matrix based on the arrangement fails, and identify a second index of the column of the parity check matrix through the mapped at least one non-zero elemental check node.

The cyclic shift may cyclically shift the at least one non-zero elemental check node included in a single row to perform a CNU operation with respect to the single row.

According to example embodiments, a method of scheduling a parity check matrix that may prevent a memory access conflict occurring when fast decoding is performed using LDPC codes, and an LDPC decoder for performing the method are provided.

According to example embodiments, a method of scheduling a parity check matrix that may prevent a memory access conflict by remapping at least one variable node or check node through a cyclic shift of the at least one variable node or check node when mapping fails, and an LDPC decoder for performing the method are provided.

According to example embodiments, an LDPC decoder that may perform fast LDPC decoding, despite a large size of a parity check matrix and a number of iterations, is provided.

BRIEF DESCRIPTION OF THE DRAWINGS

FIG. 3 illustrates a parity check matrix for scheduling according to an example embodiment.

FIG. 5 illustrates an arrangement to store generated variable nodes according to an example embodiment.

FIG. 7 illustrates a parity check matrix for scheduling, the parity check matrix different from that of FIG. 3, according to an example embodiment.

FIG. 8 illustrates an arrangement to store generated variable nodes according to an example embodiment.

DETAILED DESCRIPTION

The following structural or functional descriptions are exemplary to merely describe the example embodiments, and the scope of the example embodiments is not limited to the descriptions provided in the present specification. The example embodiments are to cover all modifications, equivalents, and alternatives falling within the scope of the example embodiments.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present. As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

Hereinafter, example embodiments will be described in detail with reference to the accompanying drawings.

Figure 1:
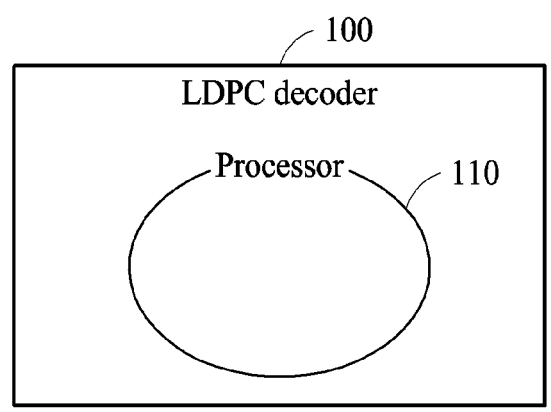
FIG. 1 illustrates a low-density parity-check (LDPC) decoder according to an example embodiment.

FIG. 1 illustrates a low-density parity-check (LDPC) decoder according to an example embodiment.

An LDPC decoder 100 may decode LDPC codes using a parity check matrix through an processor 110.

The parity check matrix is a binary matrix with the majority of elements being "0" and a portion of the elements being "1". A size of a parity check matrix actually used for coding or decoding is greater than or equal to $10^5$ bits. Thus, a large-capacity processor may be needed to process the parity check matrix.

Through the processor 110, the LDPC decoder 100 may perform fast decoding by processing received bits in parallel. Hereinafter, a method of scheduling the parity check matrix to prevent a memory access conflict during fast decoding will be described with reference to the drawings.

Figure 2A:
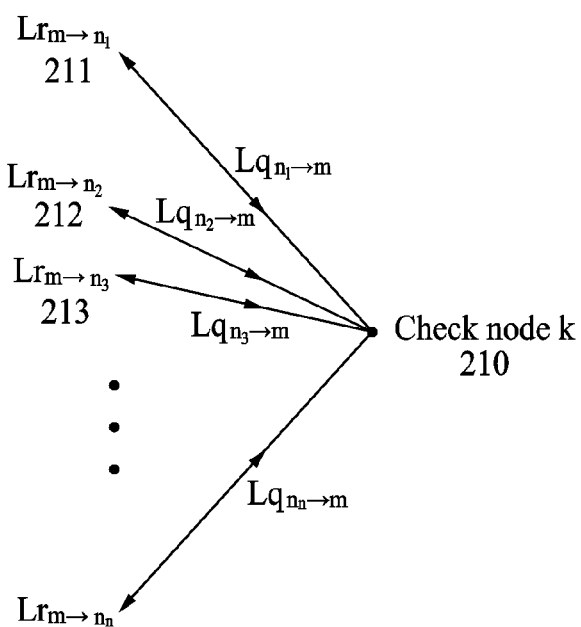
FIGS. 2A and 2B illustrate a check node update (CNU) and a variable node update (VNU), respectively, according to an example embodiment.
Figure 2B:
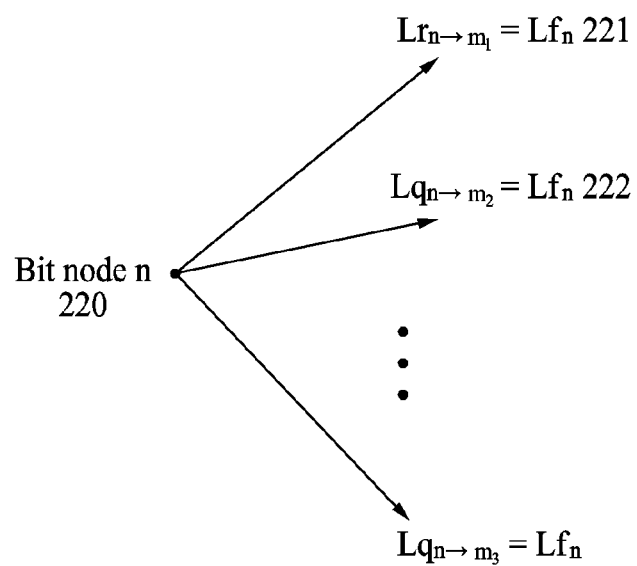

FIGS. 2A and 2B illustrate a check node update (CNU) and a variable node update (VNU), respectively, according to an example embodiment.

A decoding algorithm performed by an LDPC decoder may be described based on the following three operations.

First, a probability value from a check node to a bit node may be updated. For this, initialization as expressed by Equation 1 may be performed to obtain a channel estimation to correct an error in a channel included in data received by the LDPC decoder. The bit node can have the same meaning as a variable node.

$$Lq_{n \to m_i} = Lf_n - L_c \cdot r_n \left( L_c = \frac{2}{\sigma^2} \right), \quad \text{[Equation 1]}$$

$n = 0, 1, \ldots, N-1, i = 1, 2, \ldots, deg(\text{bit node } n).$

Second, when initialized, a CNU of updating the check node may be performed. FIG. 2A illustrates an example of calculating a probability with respect to decision values of data that may be input from a CNU which is a check node operation module into a single check node.

The number of "1"s included in rows or columns of a parity check matrix may be indicated using a weight. If assuming $n_{dc}$ row weights, the probability of the data that may be input for each check node operation may be calculated using Equation 2.

$$Lr_{k \to n_i} = g(Lq_{n_j \to k}, Lq_{n_2 \to k}, \ldots, Lq_{n_{i-1} \to k}, Lq_{n_{i+1} \to k} \ldots, Lq_{n_{dc} \to k}). \quad \text{[Equation 2]}$$

$Lr_{k \to n_i}$ denotes a log likelihood ratio (LLR) which is a probability of data input from a k-th check node into an $n_i$-th bit node, and $Lq_{n_i \to k}$ denotes an LLR input from a bit node $n_i$ into the k-th check node. If calculated using a log value with respect to the actual data, the check node operation may be expressed by Equation 3.

$$g(a, b) = \text{sign}(a) \times \text{sign}(b) \times \{\min(|a|, |b|)\} + LUT_g(a, b) \quad \text{[Equation 3]}$$
$$= \ln\left(\frac{e^{a+b} + 1}{e^a + e^b}\right)$$

$$LUT_g(a, b) = \ln(1 + e^{-|a+b|}) - \ln(1 + e^{-|a-b|}) \quad \text{[Equation 4]}$$

Thus, when a single lookup table of $LUT(x) = \ln(1+e^{-x})$ is provided, the CNU of Equation 2 may be calculated.

Third, when bits connected to each check node are updated in the CNU, a probability of a bit node corresponding to each column of the parity check matrix may be calculated based on Equations 5 and 6.

$$g(a, b) = \text{sign}(a) \times \text{sign}(b) \times \{\min(|a|, |b|) - LUT_g(|a - b|)\} \quad \text{[Equation 5]}$$
$$g(a, b, c, d) = g(g(g(a, b), c), d)$$
$$L_r(a) = g(b, c, d) \quad L_r(b) = g(a, c, d)$$
$$L_r(c) = g(a, b, d) \quad L_r(d) = g(a, b, c)$$

$$Lq_{n \to m_i} = Lf_n + \sum_{j \neq i} Lr_{m_j \to n} \quad \text{[Equation 6]}$$

Figure 3:
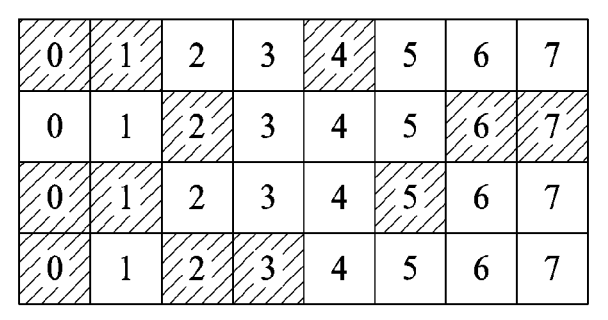

FIG. 3 illustrates a parity check matrix for scheduling according to an example embodiment.

Referring to FIG. 3, a size of a parity check matrix is 7×4, and portions with hatches represent non-zero elements (NZE) for operation. For example, the parity check matrix includes (0, 1, 4) NZEs in a first row, (2, 6, 7) NZEs in a second row, (0, 1, 5) NZEs in a third row, and (0, 2, 3) NZEs in a fourth row.

Thus, a first index identified by grouping the variable nodes of the parity check matrix of FIG. 3 based on the rows of the parity check matrix may indicate {(0, 1, 4) (2, 6, 7) (0, 1, 5) (0, 2, 3)}.

An LDPC decoder may use LDPC codes using the parity check matrix. The parity check matrix is a binary matrix with the majority of elements being "0" and a portion of the elements being "1". A size of a parity check matrix actually used for coding or decoding is greater than or equal to $10^5$ bits. Thus, a large-capacity memory may be needed to store the parity check matrix.

Figure 4:
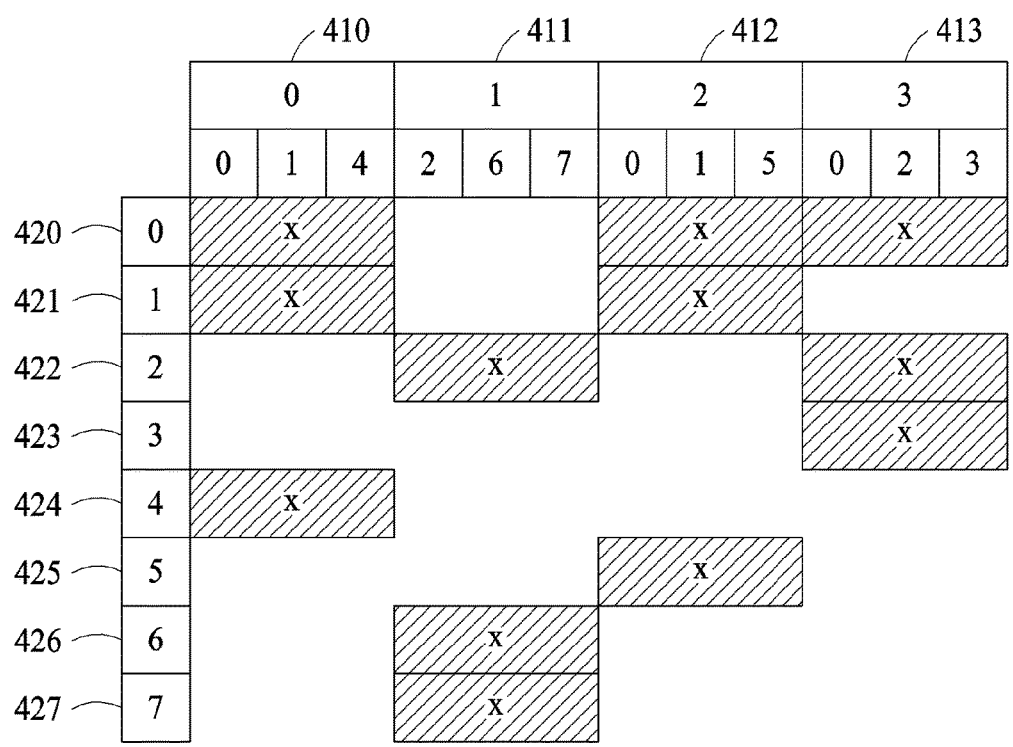
FIG. 4 illustrates path setting to prevent a memory conflict according to an example embodiment.

FIG. 4 illustrates path setting to prevent a memory conflict according to an example embodiment.

To simultaneously perform a CNU and a variable node update (VNU) without causing a memory conflict, path settings to position variable nodes may be performed in FIG. 4.

410 through 413 of FIG. 4 may indicate rows of a parity check matrix. For example, the horizontal line 0 410 may indicate a first row of the parity check matrix, the horizontal line 1 411 may indicate a second row of the parity check matrix, the horizontal line 2 412 may indicate a third row of the parity check matrix, and the horizontal line 3 413 may indicate a fourth row of the parity check matrix.

Thus, the horizontal line 0 410 may include non-zero elemental variable nodes (0, 1, 4) included in the first row of the parity check matrix, the horizontal line 1 411 may include non-zero elemental variable nodes (2, 6, 7) included in the second row of the parity check matrix, the horizontal line 2 412 may include non-zero elemental variable nodes (0, 1, 5) included in the third row of the parity check matrix, and the horizontal line 3 413 may include non-zero elemental variable nodes (0, 2, 3) included in the fourth row of the parity check matrix.

420 through 427 of FIG. 4 may indicate columns of the parity check matrix. For example, the vertical line 0 420 may indicate a first column of the parity check matrix, the vertical line 1 421 may indicate a second column of the parity check matrix, the vertical line 2 422 may indicate a third column of the parity check matrix, the vertical line 3 423 may indicate a fourth column of the parity check matrix, the vertical line 4 424 may indicate a fifth column of the parity check matrix, the vertical line 5 425 may indicate a sixth column of the parity check matrix, the vertical line 6 426 may indicate a seventh column of the parity check matrix, and the vertical line 7 427 may indicate an eighth column of the parity check matrix.

In an example, a portion of the vertical lines 420 through 427 indicating the same numbers of the non-zero elemental variable nodes included in the horizontal lines 410 through 413 may be marked. Here, the marked portions may be positions to which an arrangement of variable nodes may not be mapped, as described hereinafter.

For example, the vertical lines 420, 421, and 424 indicating the same numbers of the non-zero elemental variable nodes (0, 1, 4) included in the horizontal line 0 410 of FIG. 4 may be marked. The vertical lines 422, 426, and 427 indicating the same numbers of the non-zero elemental variable nodes (2, 6, 7) included in the horizontal line 1 411 may be marked. The vertical lines 420, 421, and 425 indicating the same numbers of the non-zero elemental variable nodes (0, 1, 5) included in the horizontal line 2 412 may be marked. The vertical lines 420, 422, and 423 indicating the same numbers of the non-zero elemental variable nodes (0, 2, 3) included in the horizontal line 3 413 may be marked.

By arranging the variable nodes at positions other than the marked positions of FIG. 4, a second index of columns of the parity check matrix may be identified. The CNU and the VNU may be simultaneously performed using a first index of the rows of the parity check matrix and the second index of the columns of the parity check matrix without causing a memory conflict.

Figure 5:
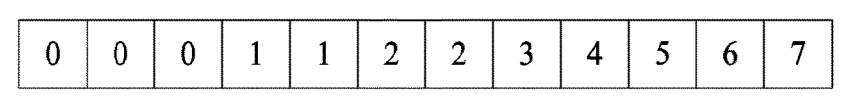

FIG. 5 illustrates an arrangement to store generated variable nodes according to an example embodiment.

An arrangement of variable nodes may indicate a sequential arrangement of non-zero elemental variable nodes based on a column of a parity check matrix.

For example, in the parity check matrix of FIG. 3, non-zero elemental variable nodes (0, 0, 0) in the first column, non-zero elemental variable nodes (1, 1) in the second column, non-zero elemental variable nodes (2, 2) in the third column, a non-zero elemental variable node (3) in the fourth column, a non-zero elemental variable node (4) in the fifth column, a non-zero elemental variable node (5) in the sixth column, a non-zero elemental variable node (6) in the seventh column, and a non-zero elemental variable node (7) in the eighth column may be sequentially arranged as (0, 0, 0, 1, 1, 2, 2, 3, 4, 5, 6, 7).

Figure 6:
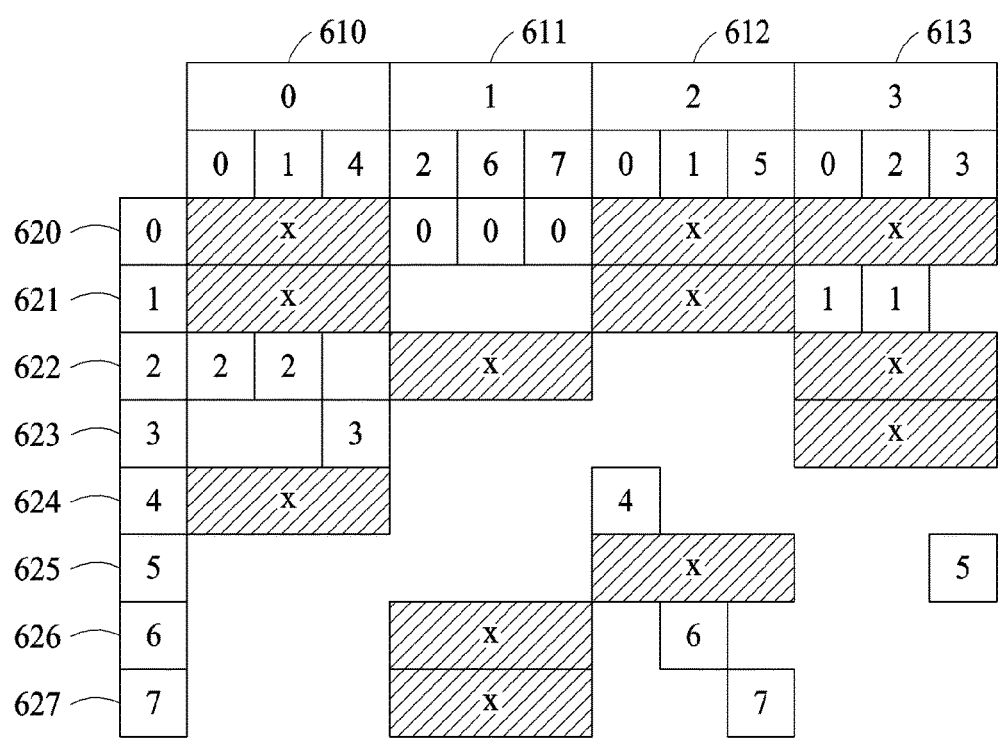
FIG. 6 illustrates an arrangement of variable nodes mapped to a path set through FIG. 4 according to an example embodiment.

FIG. 6 illustrates an arrangement of variable nodes mapped to a path set through FIG. 4 according to an example embodiment.

In an example, hereinafter, mapping using the arrangement of the variable nodes calculated through FIG. 5 will be described.

In the arrangement of the variable nodes, three "0"s may be mapped to a position at which a horizontal line 1 611 and a vertical line 0 620 intersect. Here, the three "0"s may be sequentially mapped to non-zero elemental variable nodes (2, 6, 7) included in the horizontal line 1 611.

In the arrangement of the variable nodes, two "1"s may be mapped to a position at which a horizontal line 3 613 and a vertical line 1 621 intersect. Here, the two "1"s may be sequentially mapped to (0, 2) of non-zero elemental variable nodes (0, 2, 3) included in the horizontal line 3 613. In this example, the two "1"s may not be sequentially mapped to the non-zero elemental variable nodes (2, 6, 7) included in the horizontal line 1 611. That is because the three "0"s were already sequentially mapped to the non-zero elemental variable nodes (2, 6, 7) included in the horizontal line 1 611.

In the arrangement of the variable nodes, two "2"s may be mapped to a position at which a horizontal line 0 610 and a vertical line 2 622 intersect. Here, the two "2"s may be sequentially mapped to (0, 1) of non-zero elemental variable nodes (0, 1, 4) included in the horizontal line 0 610. In this example, the two "2"s may not be sequentially mapped to non-zero elemental variable nodes (0, 1, 5) included in a horizontal line 2 612. That is because mapping is set to be performed sequentially.

In the arrangement of the variable nodes, one "3" may be mapped to a position at which the horizontal line 0 610 and a vertical line 3 623 intersect. Here, the one "3" may be mapped to (4) of the non-zero elemental variable nodes (0, 1, 4) included in the horizontal line 0 610. In this example, the one "3" may not be mapped to one of the non-zero elemental variable nodes (0, 1) included in the horizontal line 0 610. That is because the two "2"s were previously sequentially mapped to (0, 1).

In the arrangement of the variable nodes, one "4" may be mapped to a position at which the horizontal line 2 612 and a vertical line 4 624 intersect. Here, the one "4" may be mapped to (0) of the non-zero elemental variable nodes (0, 1, 5) included in the horizontal line 2 612. In this example, the one "4" may not be mapped to (1, 5) of the non-zero elemental variable nodes (0, 1, 5) included in the horizontal line 2 612. That is because mapping is set to be performed sequentially. Further, the one "4" may not be mapped to the non-zero elemental variable nodes (2, 6, 7) included in the horizontal line 1 611. That is because other variable nodes were already mapped thereto.

In the arrangement of the variable nodes, one "5" may be mapped to a position at which the horizontal line 3 613 and a vertical line 5 625 intersect. Here, the one "5" may be mapped to (3) of the non-zero elemental variable nodes (0, 2, 3) included in the horizontal line 3 613. In this example, the one "5" may not be mapped to (0, 2) of the non-zero elemental variable nodes (0, 2, 3) included in the horizontal line 3 613. Further, the one "5" may not be mapped to the non-zero elemental variable nodes included in the horizontal line 0 610 and the horizontal line 1 611. That is because other variable nodes were already mapped thereto.

In the arrangement of the variable nodes, one "6" may be mapped to a position at which the horizontal line 2 612 and a vertical line 6 626 intersect. Here, the one "6" may be mapped to (1) of the non-zero elemental variable nodes (0, 1, 5) included in the horizontal line 2 612. In this example, the one "6" may not be mapped to (0, 5) of the non-zero elemental variable nodes (0, 1, 5) included in the horizontal line 2 612. That is because mapping is set to be performed sequentially, and other variable nodes were already mapped thereto. Further, the one "6" may not be mapped to the non-zero elemental variable nodes (0, 1, 4) included in the horizontal line 0 610. That is because other variable nodes were already mapped thereto.

In the arrangement of the variable nodes, one "7" may be mapped to a position at which the horizontal line 2 612 and a vertical line 7 627 intersect. Here, the one "7" may be mapped to (5) of the non-zero elemental variable nodes (0, 1, 5) included in the horizontal line 2 612. In this example, the one "7" may not be mapped to (0, 1) of the non-zero elemental variable nodes (0, 1, 5) included in the horizontal line 2 612. That is because mapping is set to be performed sequentially, and other variable nodes were already mapped thereto. Further, the one "7" may not be mapped to the non-zero elemental variable nodes (0, 1, 4) included in the horizontal line 0 610. That is because other variable nodes were already mapped thereto.

In an example, a first index identified by grouping the variable nodes of the parity check matrix based on the rows of the parity check matrix may indicate {(0, 1, 4) (2, 6, 7) (0, 1, 5) (0, 2, 3)}.

In another example, a second index identified by extracting columns in which the non-zero elemental variable nodes are positionable using the first index, and mapping the non-zero elemental variable nodes to the extracted columns based on the arrangement may indicate {(2, 2, 3) (0, 0, 0) (4, 6, 7) (1, 1, 5)}. Thus, a VNU and a CNU may be simultaneously performed using the first index and the second index without causing a memory conflict.

In an example, an LDPC decoder may simultaneously perform a second vertical VNU operation and a third vertical VNU operation through (2, 2, 3) identified in the second index, when performing a CNU operation of the first row of the parity check matrix.

In another example, the LDPC decoder may simultaneously perform a zeroth vertical VNU operation through (0, 0, 0) identified in the second index, when performing a CNU operation of the second row of the parity check matrix.

In still another example, the LDPC decoder may simultaneously perform a fourth vertical VNU operation, a sixth vertical VNU operation, and a seventh vertical VNU operation through (4, 6, 7) identified in the second index, when performing a CNU operation of the third row of the parity check matrix.

In yet another example, the LDPC decoder may simultaneously perform a first vertical VNU operation and a fifth vertical VNU operation through (1, 1, 5) identified in the second index, when performing a CNU operation of the fourth row of the parity check matrix.

Figure 7:
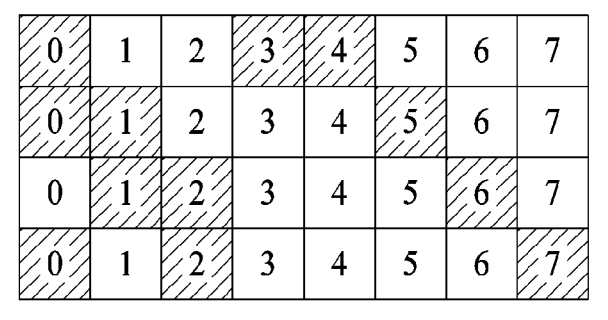

FIG. 7 illustrates a parity check matrix for scheduling, the parity check matrix different from that of FIG. 3, according to an example embodiment.

Portions with hatches in a parity check matrix of FIG. 7 represent NZEs. For example, the parity check matrix includes (0, 3, 4) NZEs in a first row, (0, 1, 5) NZEs in a second row, (1, 2, 6) NZEs in a third row, and (0, 2, 7) NZEs in a fourth row.

Thus, a first index identified by grouping the variable nodes of the parity check matrix of FIG. 7 based on the rows of the parity check matrix may indicate {(0, 3, 4) (0, 1, 5) (1, 2, 6) (0, 2, 7)}.

Figure 8:
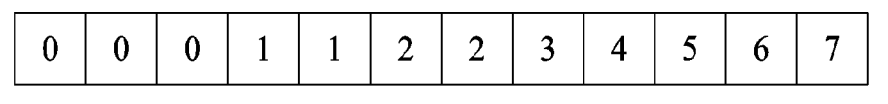
Figure 9:
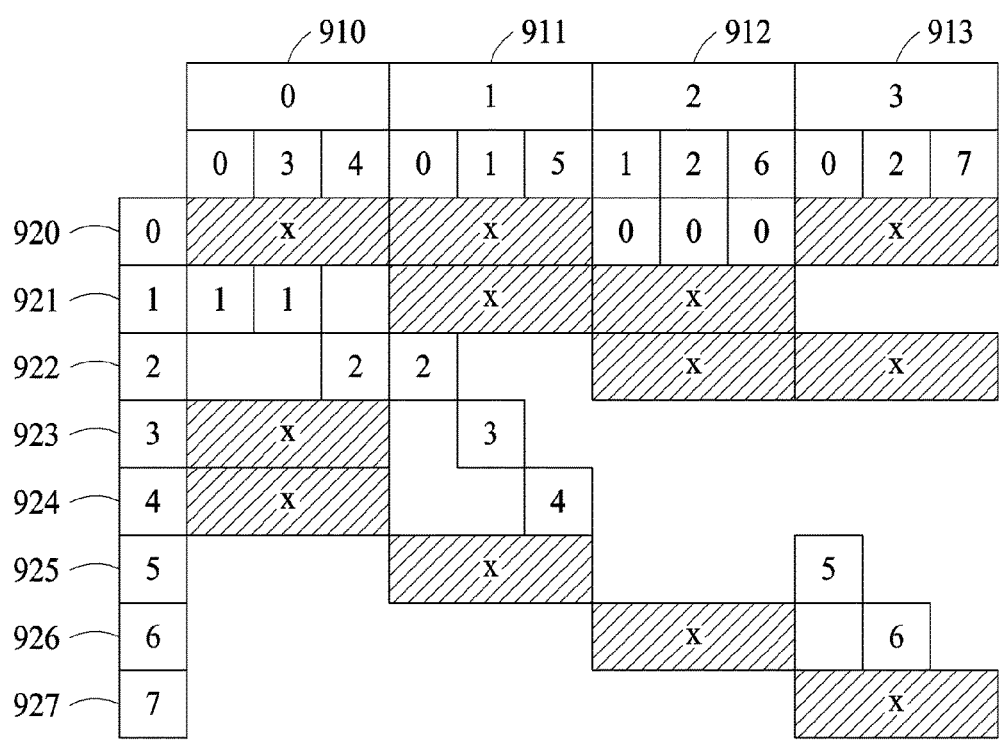
FIG. 9 illustrates a case in which path setting to prevent a memory conflict fails according to an example embodiment.

As shown in FIG. 9, unlike FIG. 3, the parity check matrix of FIG. 7 may be a matrix in which mapping of an arrangement of the variable nodes is impossible. Thus, examples of mapping through a cyclic shift when mapping fails will be described with reference to FIGS. 8 through 11.

FIG. 8 illustrates an arrangement to store generated variable nodes according to an example embodiment.

An arrangement of variable nodes may indicate a sequential arrangement of non-zero elemental variable nodes based on a column of a parity check matrix.

For example, in the parity check matrix of FIG. 7 non-zero elemental variable nodes (0, 0, 0) in the first column, non-zero elemental variable nodes (1, 1) in the second column, non-zero elemental variable nodes (2, 2) in the third column, a non-zero elemental variable node (3) in the fourth column, a non-zero elemental variable node (4) in the fifth column, a non-zero elemental variable node (5) in the sixth column, a non-zero elemental variable node (6) in the seventh column, and a non-zero elemental variable node (7) in the eighth column may be sequentially arranged as (0, 0, 0, 1, 1, 2, 2, 3, 4, 5, 6, 7).

FIG. 9 illustrates a case in which path setting to prevent a memory conflict fails according to an example embodiment.

To simultaneously perform a CNU and a VNU without causing a memory conflict, path settings to position variable nodes may be performed in FIG. 9.

910 through 913 of FIG. 9 may indicate rows of a parity check matrix. For example, the horizontal line 0 910 may indicate a first row of the parity check matrix, the horizontal line 1 911 may indicate a second row of the parity check matrix, the horizontal line 2 912 may indicate a third row of the parity check matrix, and the horizontal line 3 913 may indicate a fourth row of the parity check matrix.

Thus, 0 910 may include non-zero elemental variable nodes (0, 3, 4) included in the first row of the parity check matrix, 1 911 may include non-zero elemental variable nodes (0, 1, 5) included in the second row of the parity check matrix, 2 912 may include non-zero elemental variable nodes (1, 2, 6) included in the third row of the parity check matrix, and 3 913 may include non-zero elemental variable nodes (0, 2, 7) included in the fourth row of the parity check matrix.

920 through 927 of FIG. 9 may indicate columns of the parity check matrix. For example, the vertical line 0 920 may indicate a first column of the parity check matrix, the vertical line 1 921 may indicate a second column of the parity check matrix, the vertical line 2 922 may indicate a third column of the parity check matrix, the vertical line 3 923 may indicate a fourth column of the parity check matrix, the vertical line 4 924 may indicate a fifth column of the parity check matrix, the vertical line 5 925 may indicate a sixth column of the parity check matrix, the vertical line 6 926 may indicate a seventh column of the parity check matrix, and the vertical line 7 927 may indicate an eighth column of the parity check matrix.

In an example, a portion of the vertical lines 920 through 927 indicating the same numbers of the non-zero elements as those included in the horizontal lines 910 through 913 of FIG. 9 may be marked. Here, the marked portions may be positions to which an arrangement of variable nodes may not be mapped, as described hereinafter.

For example, the vertical lines 920, 923, and 924 indicating the same numbers of the non-zero elemental variable nodes (0, 3, 4) included in the horizontal line 0 910 of FIG. 9 may be marked. The vertical lines 920, 921, and 925 indicating the same numbers of the non-zero elemental variable nodes as (0, 1, 5) included in the horizontal line 1 911 of FIG. 9 may be marked. The vertical lines 921, 922, and 926 indicating the same numbers of the non-zero elemental variable nodes (1, 2, 6) included in the horizontal line 2 912 of FIG. 9 may be marked. The vertical lines 920, 922, and 927 indicating the same numbers of the non-zero elemental variable nodes (0, 2, 7) included in the horizontal line 3 913 of FIG. 9 may be marked.

By arranging the variable nodes at positions other than the marked positions of FIG. 9, a second index of columns of the parity check matrix may be identified. The CNU and the VNU may be simultaneously performed using a first index of the rows of the parity check matrix and the second index of the columns of the parity check matrix without causing a memory conflict.

In an example, hereinafter, mapping using the arrangement of the variable nodes calculated through FIG. 8 will be described.

In the arrangement of the variable nodes, three "0"s, two "1"s, two "2"s, one "3", one "4", one "5", and one "6" may be mapped as shown in FIG. 9, using the method described with reference to FIGS. 4 through 6. However, as shown in FIG. 9, one "7" may not be mapped. Thus, hereinafter, a solution through a cyclic shift of the arrangement of the variable nodes when mapping fails will be described with reference to FIG. 10.

Figure 10:
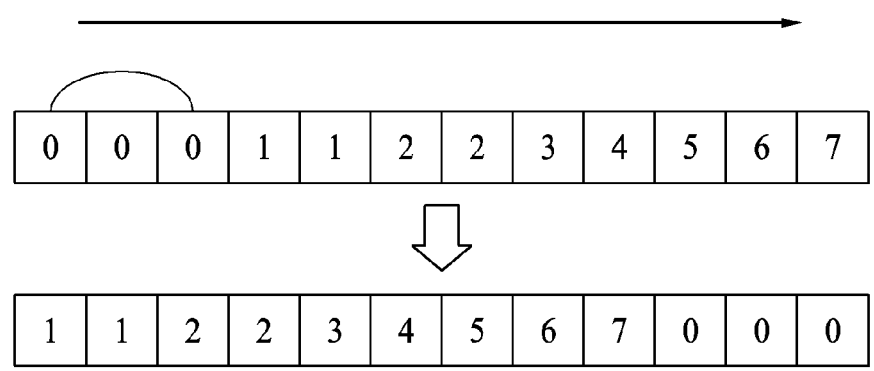
FIG. 10 illustrates a cyclic shift of variable nodes when mapping fails according to an example embodiment.

FIG. 10 illustrates a cyclic shift of variable nodes when mapping fails according to an example embodiment.

When mapping using the arrangement of the variable nodes of FIG. 8 fails, a cyclic shift of the arrangement of the variable nodes may be performed as shown in FIG. 10.

Three "0"s may be shifted since the three "0"s may be classified as a single column in FIG. 8. For example, the three "0"s shown in the first column of FIG. 8 may be classified as a single column, and thus may be shifted together. That is because a VNU operation needs to be performed with respect to a single column.

For example, in a case in which a parity check matrix is a 100*200 matrix and thirty non-zero elemental variable nodes are included in a first column of the parity check matrix, a cyclic shift of the thirty non-zero elemental variable nodes may be performed to map the variable nodes.

Figure 11:
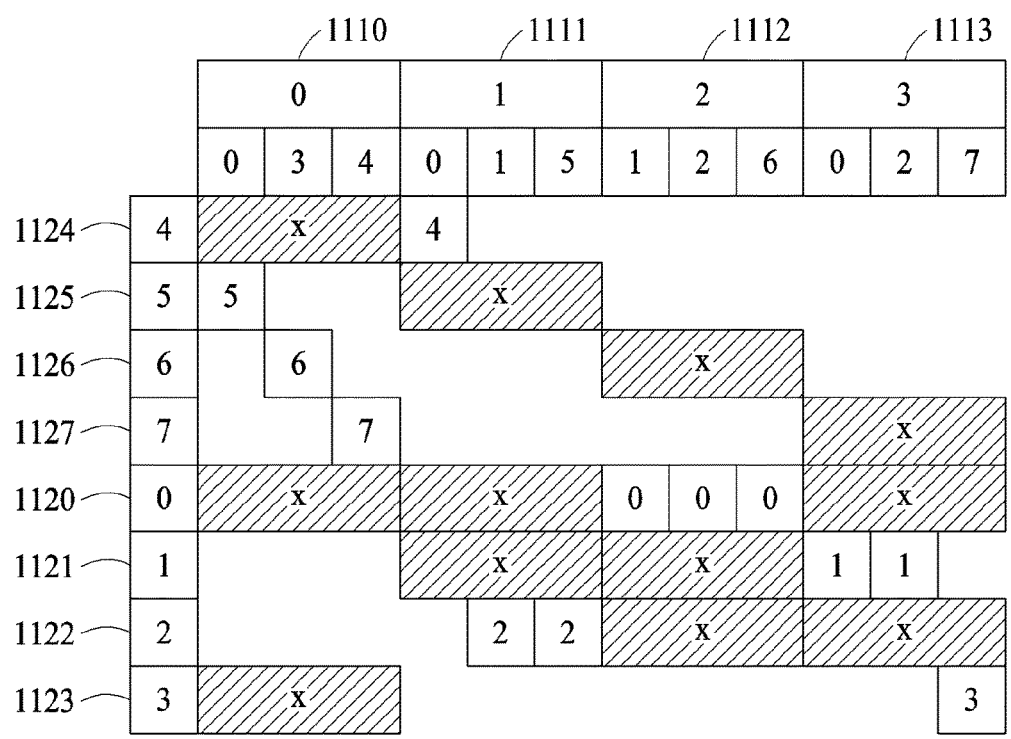
FIG. 11 illustrates remapping using an arrangement of cyclically shifted variable nodes when mapping fails according to an example embodiment.

FIG. 11 illustrates remapping using an arrangement of cyclically shifted variable nodes when mapping fails according to an example embodiment. For ease of expression, horizontal lines and vertical lines are switched, which is a final mapping form.

In the arrangement of the variable nodes, one "4" may be mapped to a position at which a horizontal line 1 1111 and a vertical line 4 1124 intersect. Here, the one "4" may be mapped to (0) of non-zero elemental variable nodes (0, 1, 5) included in the horizontal line 1 1111. In this example, the one "4" may not be mapped to (1, 5) of the non-zero elemental variable nodes (0, 1, 5) included in the horizontal line 1 1111. That is because mapping is set to be performed sequentially.

In the arrangement of the variable nodes, one "5" may be mapped to a position at which a horizontal line 0 1110 and a vertical line 5 1125 intersect. Here, the one "5" may be mapped to (0) of non-zero elemental variable nodes (0, 3, 4) included in the horizontal line 0 1110. In this example, the one "5" may not be mapped to (3, 4) of the non-zero elemental variable nodes (0, 3, 4) included in the horizontal line 0 1110. That is because mapping is set to be performed sequentially.

In the arrangement of the variable nodes, one "6" may be mapped to a position at which the horizontal line 0 1110 and a vertical line 6 1126 intersect. Here, the one "6" may be mapped to (3) of the non-zero elemental variable nodes (0, 3, 4) included in the horizontal line 0 1110. In this example, the one "6" may not be mapped to (0, 4) of the non-zero elemental variable nodes (0, 3, 4) included in the horizontal line 0 1110. That is because mapping is set to be performed sequentially, and other variable nodes were already mapped thereto.

In the arrangement of the variable nodes, one "7" may be mapped to a position at which the horizontal line 0 1110 and a vertical line 7 1127 intersect. Here, the one "7" may be mapped to (4) of the non-zero elemental variable nodes (0, 3, 4) included in the horizontal line 0 1110. In this example, the one "7" may not be mapped to (0, 3) of the non-zero elemental variable nodes (0, 3, 4) included in the horizontal line 0 1110. That is because mapping is set to be performed sequentially, and other variable nodes were already mapped thereto.

In the arrangement of the variable nodes, three "0"s may be mapped to a position at which a horizontal line 2 1112 and a vertical line 0 1120 intersect. Here, the three "0"s may be sequentially mapped to non-zero elemental variable nodes (1, 2, 6) included in the horizontal line 2 1112.

In the arrangement of the variable nodes, two "1"s may be mapped to a position at which a horizontal line 3 1113 and a vertical line 1 1121 intersect. Here, the two "1"s may be sequentially mapped to (0, 2) of non-zero elemental variable nodes (0, 2, 7) included in the horizontal line 3 1113. Further, the two "1"s may not be sequentially mapped to the horizontal line 0 1110 to which other variable nodes were already mapped.

In the arrangement of the variable nodes, two "2"s may be mapped to a position at which the horizontal line 1 1111 and a vertical line 3 1122 intersect. Here, the two "2"s may be sequentially mapped to (1, 5) of the non-zero elemental variable nodes (0, 1, 5) included in the horizontal line 1 1111. That is because another variable node was already mapped to (0) of (0, 1, 5).

In the arrangement of the variable nodes, one "3" may be mapped to a position at which the horizontal line 3 1113 and a vertical line 3 1123 intersect. Here, the one "3" may be mapped to (7) of the non-zero elemental variable nodes (0, 2, 7) included in the horizontal line 3 1113. In this example, the one "3" may not be mapped to (0, 2) of the non-zero elemental variable nodes (0, 2, 7) included in the horizontal line 3 1113. That is because mapping is set to be performed sequentially, and other variable nodes were already mapped thereto.

In an example, a first index identified by grouping the variable nodes of the parity check matrix based on the rows of the parity check matrix may indicate {(0, 3, 4) (0, 1, 5) (1, 2, 6) (0, 2, 7)}.

In another example, a second index identified by extracting columns in which the non-zero elemental variable nodes are positionable using the first index, and mapping the non-zero elemental variable nodes to the extracted columns based on the arrangement may indicate {(5, 6, 7) (4, 2, 2) (0, 0, 0) (1, 1, 3)}.

Thus, a VNU and a CNU may be simultaneously performed using the first index and the second index without causing a memory conflict.

In an example, an LDPC decoder may simultaneously perform a fifth vertical VNU operation, a sixth vertical VNU operation, and a seventh vertical VNU operation through (5, 6, 7) identified in the second index, when performing a CNU operation of the first row of the parity check matrix.

In another example, the LDPC decoder may simultaneously perform a fourth vertical VNU operation and a second vertical VNU operation through (4, 2, 2) identified in the second index, when performing a CNU operation of the second row of the parity check matrix.

In still another example, the LDPC decoder may simultaneously perform a zeroth vertical operation through (0, 0, 0) identified in the second index, when performing a CNU operation of the third row of the parity check matrix.

In yet another example, the LDPC decoder may simultaneously perform a first vertical VNU operation and a third vertical VNU operation through (1, 1, 3) identified in the second index, when performing a CNU operation of the fourth row of the parity check matrix.

In a case in which a rearrangement through the cyclic shift of the arrangement of the variable nodes fails, the rearrangement may be performed through a cyclic shift of an arrangement of check nodes.

In a case in which the rearrangement fails in a single cycle of the cyclic shift of the arrangement of the variable nodes, a vertical cyclic shift of placing the first row of FIG. 3 at the bottom and shifting up the remaining rows each by one may be performed. After that, the rearrangement may be performed by performing the cyclic shift of the variable nodes again.

Figure 12:
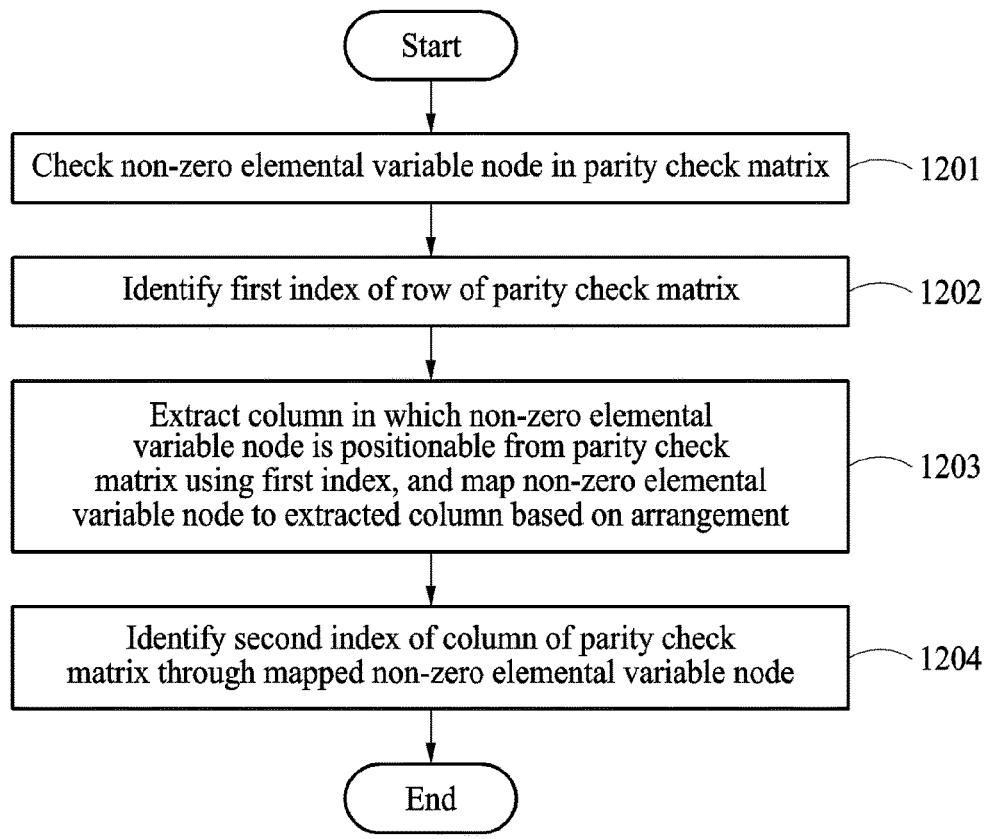
FIG. 12 illustrates a method of scheduling a parity check matrix, the method performed by an LDPC decoder, according to an example embodiment.

FIG. 12 illustrates a method of scheduling a parity check matrix, the method performed by an LDPC decoder, according to an example embodiment.

In operation 1201, an LDPC decoder may check at least one non-zero elemental variable node in a parity check matrix.

In operation 1202, the LDPC decoder may identify a first index of a row of the parity check matrix in the at least one non-zero elemental variable node. Here, the first index may be formed by grouping the at least one non-zero elemental variable node of the parity check matrix based on the row.

In operation 1203, the LDPC decoder may extract a column in which the at least one non-zero elemental variable node is positionable from the parity check matrix using the first index, and map the at least one non-zero elemental variable node to the extracted column based on an arrangement.

Here, mapping of the at least one non-zero elemental variable node may refer to identifying a position at which the at least one non-zero elemental variable node is unpositionable through the first index, and sequentially mapping the at least one non-zero elemental variable node to a position at which the at least one non-zero elemental variable node is positionable.

In this example, the arrangement of the at least one non-zero elemental variable node may be a sequential arrangement of the at least one non-zero elemental variable node based on the column of the parity check matrix.

In operation 1204, the LDPC decoder may identify a second index of the column of the parity check matrix through the mapped at least one non-zero elemental variable node. Here, the second index may indicate a column of the parity check matrix used along with the row corresponding to the first index to simultaneously perform the CNU and the VNU.

The LDPC decoder may simultaneously perform the CNU and the VNU using the first index and the second index, without causing a memory access conflict.

Figure 13:
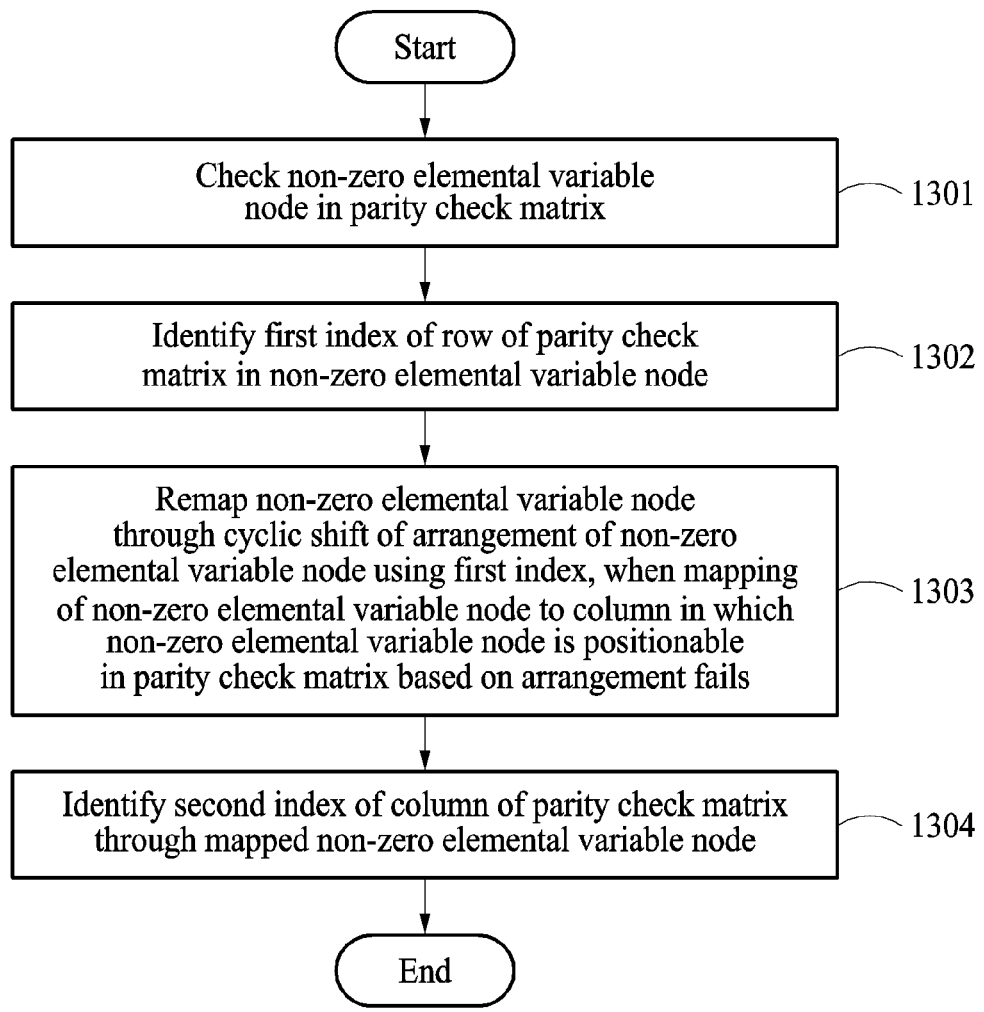
FIG. 13 illustrates a method of scheduling a parity check matrix through a cyclic shift of variable nodes, the method performed by an LDPC decoder, according to an example embodiment.

FIG. 13 illustrates a method of scheduling a parity check matrix through a cyclic shift of variable nodes, the method performed by an LDPC decoder, according to an example embodiment.

In operation 1301, an LDPC decoder may check at least one non-zero elemental variable node in a parity check matrix.

In operation 1302, the LDPC decoder may identify a first index of a row of the parity check matrix in the at least one non-zero elemental variable node. Here, the first index may be formed by grouping the at least one non-zero elemental variable node of the parity check matrix based on the row.

In operation 1303, the LDPC decoder may remap the at least one non-zero elemental variable node through a cyclic shift of an arrangement of the at least one non-zero elemental variable node using the first index, when mapping of the at least one non-zero elemental variable node to a column in which the at least one non-zero elemental variable node is positionable in the parity check matrix based on the arrangement fails.

Here, the cyclic shift may refer to simultaneously cyclically shifting the at least one non-zero elemental variable node included in a single column of the parity check matrix to perform a VNU operation with respect to the single column of the parity check matrix.

In operation 1304, the LDPC decoder may identify a second index of a column of the parity check matrix through the mapped at least one non-zero elemental variable node. Here, the second index may indicate a column of the parity check matrix used along with the row corresponding to the first index to simultaneously perform the CNU and the VNU.

The LDPC decoder may simultaneously perform the CNU and the VNU using the first index and the second index, without causing a memory access conflict.

Figure 14:
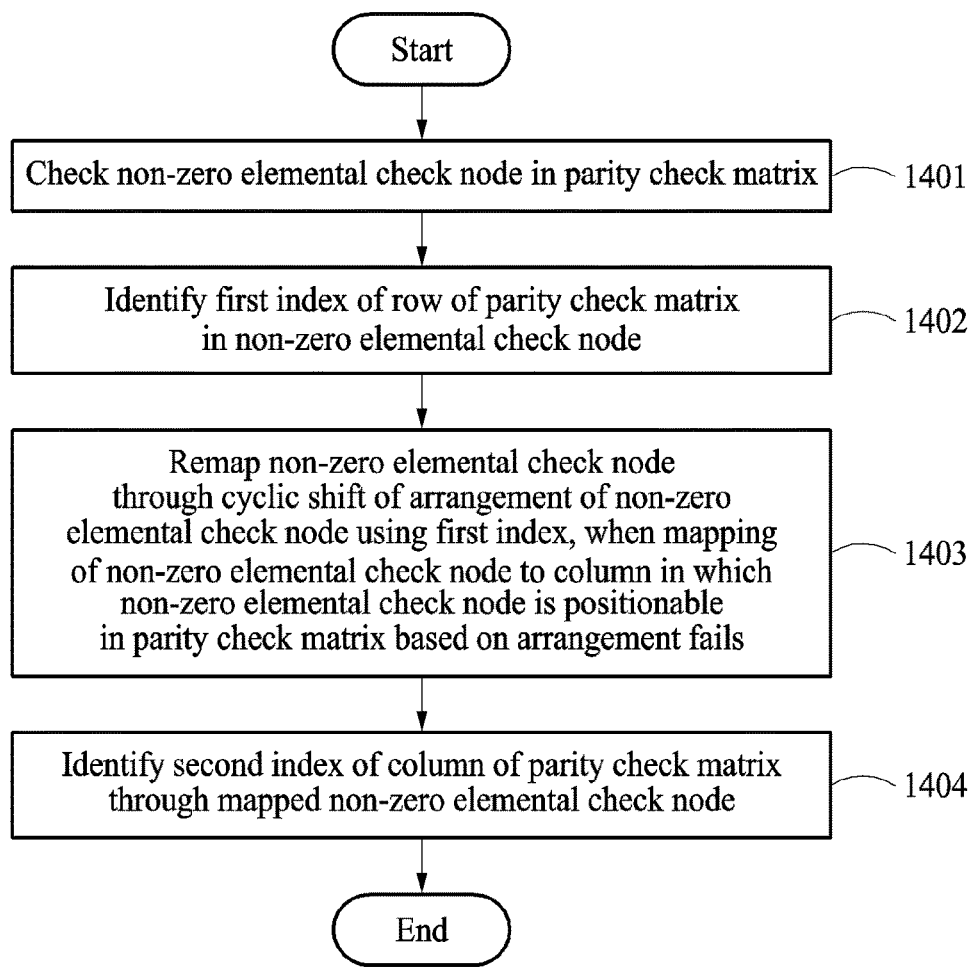
FIG. 14 illustrates a method of scheduling a parity check matrix through a cyclic shift of check nodes, the method performed by an LDPC decoder, according to an example embodiment.

FIG. 14 illustrates a method of scheduling a parity check matrix through a cyclic shift of check nodes, the method performed by an LDPC decoder, according to an example embodiment.

In operation 1401, an LDPC decoder may check at least one non-zero elemental check node in a parity check matrix.

In operation 1402, the LDPC decoder may identify a first index of a row of the parity check matrix in the at least one non-zero elemental check node. Here, the first index may be formed by grouping the at least one non-zero elemental check node of the parity check matrix based on the row.

In operation 1403, the LDPC decoder may remap the at least one non-zero elemental check node through a cyclic shift of an arrangement of the at least one non-zero elemental check node using the first index, when mapping of the at least one non-zero elemental check node to a column in which the at least one non-zero elemental check node is positionable in the parity check matrix based on the arrangement fails.

Here, the cyclic shift may refer to simultaneously cyclically shifting the at least one non-zero elemental check node included in a single row of the parity check matrix to perform a CNU operation with respect to the single row of the parity check matrix.

In operation 1404, the LDPC decoder may identify a second index of a column of the parity check matrix through the mapped at least one non-zero elemental check node. Here, the second index may indicate a column of the parity check matrix used along with the row corresponding to the first index to simultaneously perform the CNU and the VNU.

The LDPC decoder may simultaneously perform the CNU and the VNU using the first index and the second index, without causing a memory access conflict.

Meanwhile, the methods described in the example embodiments may be written in a computer-executable program and implemented as various recording media such as magnetic storage media, optical reading media, and digital storage media.

Implementations or the various techniques described herein may be implemented in digital electronic circuitry, or in computer hardware, firmware, software, or in combinations thereof. Implementations may implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including complied or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors suitable for the execution of a computer program include, by way of example, both general and special purpose microprocessors, and any one or more processors of any type of digital computer. Generally, a processor will receive instructions and data from a read-only memory or a random access memory or both. The essential elements of a computer are at least one processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example, magnetic media such as a hard disk, a floppy disk and a magnetic tape, optical media such as compact disk read only memory (CD-ROM) and a digital video disk (DVD), magneto-optical media such as a floptical disk, and semiconductor memory such as read only memory (ROM), random access memory (RAM), flash memory, erasable programmable ROM (EPROM) and electrically erasable programmable ROM (EEPROM). The processor and the memory can be supplemented or incorporated by or into special purpose logic circuitry.

Further, computer-readable media may be any available media that may be accessed by computers, and may include all computer storage media and transmission media.

Although the present specification includes the details of a plurality of specific embodiments, the details should not be construed as limiting any invention or a scope that can be claimed, and on the contrary, the details should be construed as being descriptions of features that may be specific to the specific embodiments of specific inventions. Specific features described in the present specification in the context of individual embodiments may be combined and implemented in a single embodiment. On the contrary, various features described in the context of a single embodiment may be implemented in a plurality of embodiments individually or in any appropriate lower-level combination. Furthermore, although features may operate in a specific combination and features may be initially depicted as being claimed, one or more features of a claimed combination may be excluded from the combination in some cases, and the claimed combination may be changed into a lower-level combination or a modification of the lower-level combination.

In the same manner, although operations are depicted in specific order in the drawings, it should not be understood that the operations must be performed in the depicted specific or sequential order or all the shown operations must be performed in order to obtain a preferred result. In a specific case, multi-tasking and parallel processing may be advantageous. Furthermore, it should not be understood that the separation of various system components of the aforementioned embodiments is required for all the embodiments. Rather, it should be understood that the aforementioned program components and systems may be integrated into a single software product or packaged into a multiple software product.

Meanwhile, the example embodiments disclosed in the present specification and the drawings are intended merely to present specific examples in order to help to understand the present disclosure, but are not intended to limit the scope of the present disclosure. It will be apparent to those skilled in the art that various modifications based on the technical spirit of the present disclosure, as well as the disclosed example embodiments, can be made.

DESCRIPTION OF REFERENCE NUMERALS

100: LDPC decoder
110: LDPC processor

What is claimed is:

1. A processor-implemented method of scheduling a parity check matrix, performed by a low-density parity-check (LDPC) decoder, the method comprising:
   checking at least one non-zero elemental variable node in the parity check matrix;
   identifying a first index of a row of the parity check matrix in the at least one non-zero elemental variable node;
   extracting a column of the parity check matrix in which the at least one non-zero elemental variable node is positionable from the parity check matrix using the identified first index;
   mapping the at least one non-zero elemental variable node to the extracted column based on an arrangement; and
   identifying a second index of the extracted column of the parity check matrix through the mapped at least one non-zero elemental variable node.

2. The method of claim 1, further comprising:
   simultaneously performing a check node update (CNU) and a variable node update (VNU) using the identified first index and the identified second index.

3. The method of claim 2, wherein the second index indicates a column of the parity check matrix used along with a row corresponding to the first index.

4. The method of claim 1, wherein the first index is identified by grouping the at least one non-zero elemental variable node of the parity check matrix based on the row.

5. The method of claim 1, wherein the mapping comprises identifying a position at which the at least one non-zero elemental variable node is unpositionable through the first index, and sequentially positioning the at least one non-zero elemental variable node at a position at which the at least one non-zero elemental variable node is positionable.

6. The method of claim 1, wherein the arrangement is a sequential arrangement of the at least one non-zero elemental variable node based on the column of the parity check matrix.

7. The method of claim 1, further comprising:
updating the parity check matrix based on the identified first index and the identified second index, and
decoding an LDPC code by using the updated parity check matrix.

8. The method of claim 1, further comprising:
updating the parity check matrix by simultaneously performing a check node update (CNU) and a variable node update (VNU) using the identified first index and the identified second index, and
decoding an LDPC code by using the updated parity check matrix.

9. A processor-implemented method of scheduling a parity check matrix, performed by a low-density parity-check (LDPC) decoder, the method comprising:
checking at least one non-zero elemental variable node in the parity check matrix;
identifying a first index of a row of the parity check matrix in the at least one non-zero elemental variable node;
remapping the at least one non-zero elemental variable node through a cyclic shift of an arrangement of the at least one non-zero elemental variable node using the identified first index, when mapping of the at least one non-zero elemental variable node to a column of the parity check matrix in which the at least one non-zero elemental variable node is positionable in the parity check matrix based on the arrangement fails; and
identifying a second index of the column through the mapped at least one non-zero elemental variable node.

10. The method of claim 9, wherein the cyclic shift cyclically shifts the at least one non-zero elemental variable node, which is included in a single column, to perform a variable node update (VNU) operation with respect to the single column.

11. A processor-implement method of scheduling a parity check matrix, performed by a low-density parity-check (LDPC) decoder, the method comprising:
checking at least one non-zero elemental check node in the parity check matrix;
identifying a first index of a row of the parity check matrix in the at least one non-zero elemental check node;
remapping the at least one non-zero elemental check node through a cyclic shift of an arrangement of the at least one non-zero elemental check node using the identified first index, when mapping of the at least one non-zero elemental check node to a column of the parity check matrix in which the at least one non-zero elemental check node is positionable in the parity check matrix based on the arrangement fails; and
identifying a second index of the column through the mapped at least one non-zero elemental check node.

12. The method of claim 11, wherein the cyclic shift cyclically shifts the at least one non-zero elemental check node, which is included in a single row, to perform a check node update (CNU) operation with respect to the single row.

13. A non-transitory computer-readable medium storing instructions that, when executed by a processor, cause the processor to perform the method of claim 1.

14. A non-transitory computer-readable medium storing instructions that, when executed by a processor, cause the processor to perform the method of claim 9.

15. A non-transitory computer-readable medium storing instructions that, when executed by a processor, cause the processor to perform the method of claim 11.

* * * * *